United States Patent [19]

Becker et al.

[11] Patent Number: 5,001,479
[45] Date of Patent: Mar. 19, 1991

[54] GRAY CODE CONVERTER WITH ERROR SIGNAL

[75] Inventors: Norbert Becker, Giessen-Allendorf; Hans-Juergen Mueller, Braunfels, both of Fed. Rep. of Germany

[73] Assignee: Wild Leitz GmbH, Wetzlar, Fed. Rep. of Germany

[21] Appl. No.: 307,780

[22] Filed: Feb. 8, 1989

[30] Foreign Application Priority Data

Feb. 11, 1988 [DE] Fed. Rep. of Germany ....... 3804266

[51] Int. Cl.⁵ .............................................. H03M 7/16
[52] U.S. Cl. ........................................ 341/96; 341/94; 364/740
[58] Field of Search ........................ 341/96, 97, 94, 10, 341/98; 364/715.11, 736.5, 737, 740

[56] References Cited

U.S. PATENT DOCUMENTS 2,632,058  3/1953  Gray ..................................... 179/15
4,876,640 10/1989  Shankar et al. .................. 364/716 X

OTHER PUBLICATIONS

"Hewlett Packard, HCTL-2000 Technical Data", Apr. 1986, pp. 1-14.
Michael W. Butler, "Simplified Multiplier Improves Standard Shaft Encoder", Circuits and Software for Electrical Engineers, McGraw-Hill 1983, p. 86.
Kohavi, Z., "Switching and Finite Automata Theory", McGraw-Hill, New York, 1978, pp. 275-281, 322-325, 352-353.

Primary Examiner—William M. Shoop, Jr.
Assistant Examiner—Brian Young
Attorney, Agent, or Firm—Foley & Lardner, Schwartz, Jeffery, Schwaab, Mack, Blumenthal & Evans

[57] ABSTRACT

A method and circuit arrangement is disclosed for converting Gray code signals into counting pulses, forming a counter status, detecting interference signals infringing the Gray code and for forming an error signal with a network defining a finite automaton according to Moore or Mealy, wherein the network forms no error signal when a Gray code infringement is followed by a second Gray code infringement. The disclosed network arrangement in one embodiment comprises a quadruple interpolator (quadrature decoder) for precision dimension measuring machines with optoelectronic scale scanning. Interruptions of the measuring procedure and errors are reduced by not generating an error signal when a Gray code infringement is followed by a second Gray code infringement.

15 Claims, 4 Drawing Sheets

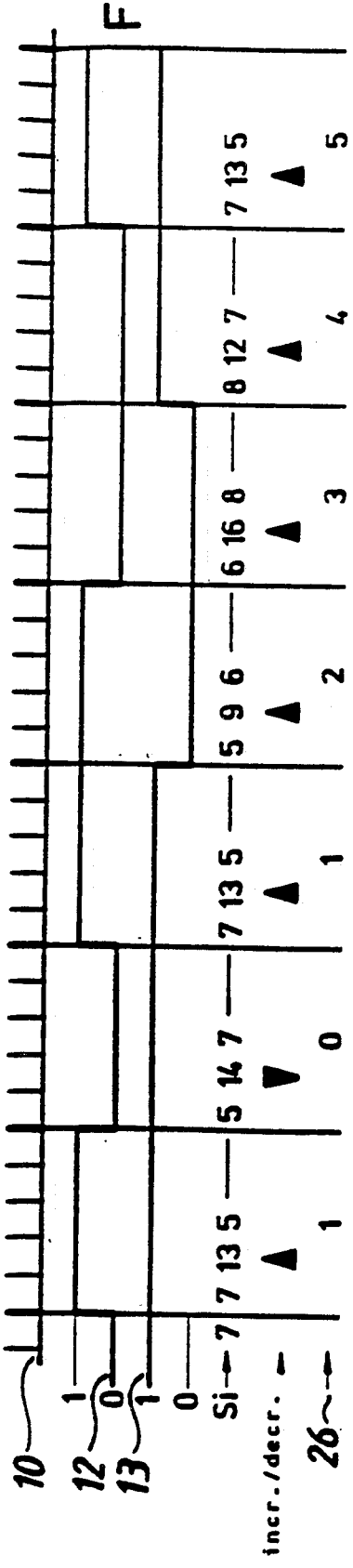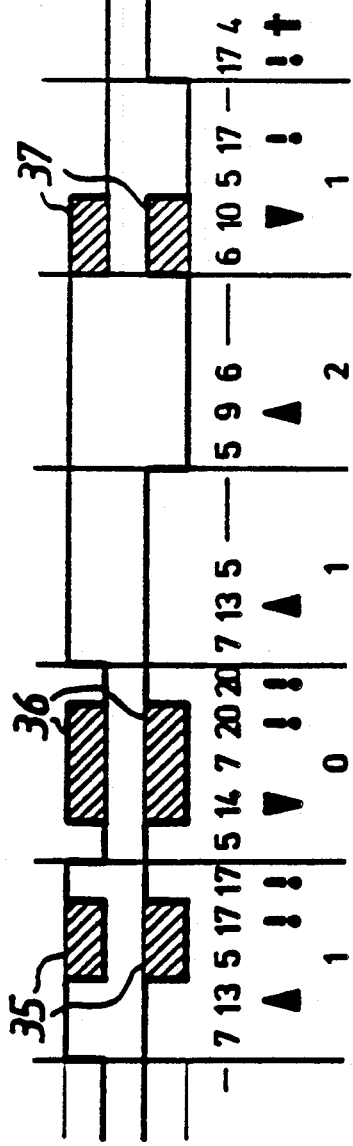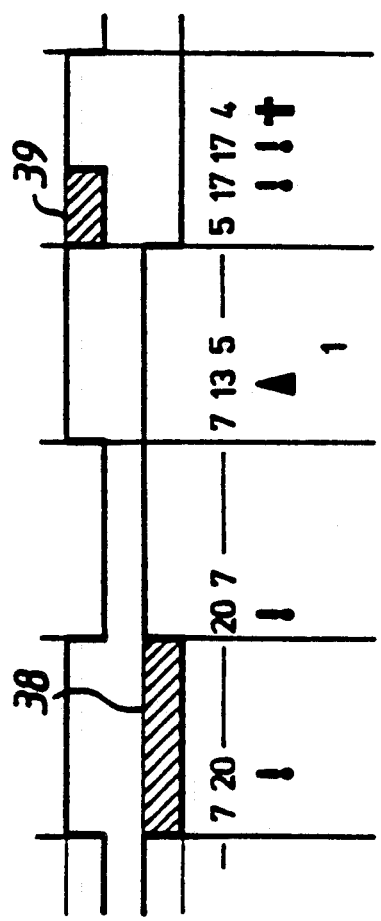

GRAY CODE CONVERTER WITH ERROR SIGNAL

BACKGROUND OF THE INVENTION

The invention relates to a method and a circuit arrangement for converting Gray code signals into counting pulses, forming a counter status, detecting interference signals infringing the Gray code, and forming an error signal.

Gray code signals are frequently obtained in precision dimension measuring machines from scale scannings via the intermediate stage of sine and cosine signals, are transferred to an evaluation device and processed there via a counter to a coordinate specification as a measurement result.

In accordance with the precision requirements of dimension measuring machines, it is important that the indicated measurement result is not falsified, for example, by interference signals coupled in electromagnetically from the environment. Interference signals which clearly deviate with their temporal course from the measurement signals, in particular from shorter pulses, can be filtered out. This function is performed in a quadrature decoder HCTL-2000 produced by Hewlett Packard (see Hewlett Packard, HCTL-2000 Technical Data April 1986).

Interference signals with a time behavior similar to the measurement signals on only one input line also usually pose no problem if their switch-on and switch-off edge simulate an incrementing and a decrementing event which when summed amount to zero and hence remain without effect.

However, interference signals are frequently impressed simultaneously in parallel signal lines for the Gray code signals. This infringes the definition of Gray code signals as stated in U.S. Pat. No. 2,632,058 issued to Gray, according to which two (or more) signal levels may never change on the parallel signal lines at the same time, in practice within a defined time interval.

Even signals which are only impressed on one input line may lead to a Gray code infringement if with one of their signal edges coincide temporally with an edge of a measurement signal on another line.

A circuit arrangement for converting Gray code signals into counting pulses and for forming a counter status is known which outputs an error message in every case where a change of the signal level occurs simultaneously on both inputs. See, for example, "Simplified Multiplier Improves Standard Shaft Encoder" by Michael M. Butler, Circuits and Software for Electrical Engineers, McGraw-Hill 1983, p. 86. Two logic square-wave signals which are derived from a scale scanning and are phase-shifted by 90° are stated as input signals. Each signal change of a signal level results in an incrementing or decrementing pulse, hence the circuit arrangement is also a quadruple interpolator.

In this circuit arrangement, the incrementing and decrementing pulses are not reliably separated temporally, which may result in malfunctions of the counter. For each error message of a Gray code converter, a measurement operation of the measuring machine must be terminated and begun anew, which is very costly in terms of time.

When an interference signal which infringes the Gray code is temporally separated from the level changes of the measurement signals, that is to say when following a simultaneous level change on two input signal lines the next level change again occurs simultaneously on these two input signal lines, then this double Gray code infringement can clearly be differentiated from a measurement signal as interference. The forming of counting pulses can therefore be suppressed and an error signal need not be formed.

If, however, a level change of a measurement signal occurs during the duration of an interference signal on two input signal lines, then this is "swallowed". The level is, however, reset on one input line at the end of the interference signal, and on the other at the next level change of the measurement signal. However, on which input line the level is reset by the interference signal and on which it is reset by the measurement signal, depends on the unknown temporal extent of interference signal and measurement signal. It is then undefinable whether an incrementing or a decrementing event is present and, in this case, an error signal must necessarily be generated.

Gray code infringements are also possible as a result of interference signals on only one signal line if by chance one edge of an interference signal temporally coincides with the edge of a measurement signal on another line.

In this case, no error message is required if by chance coincidence of the second edge of the interference signal with a second edge of the measurement signal a double Gray code infringement arises. This is only possible if the two edges of the measurement signal would have to trigger a pair of incrementing and decrementing pulses with the sum zero, so that as a result no counting is falsified.

SUMMARY OF THE INVENTION

The object of the invention is to limit the number of error messages to the minimum extent possible. Known congeneric circuit arrangements are to be simply substituted.

This object is achieved by converting Gray code signals into counting pulses; forming a counter status; detecting interference signals infringing the Gray code; and forming an error signal; wherein a finite automaton processes the Gray code signals and wherein the automaton does not form an error signal if, following a change of two input signals within a time interval which constitutes a first Gray code infringement, the next signal change within one time interval comprises two input signals which constitutes a second Gray code infringement.

More specifically, the above objects are achieved by an apparatus including a circuit arrangement for converting Gray code signals into counting pulses and for forming a counter status which detects interference pulses infringing the Gray code and forms a corresponding signal level at an error output, wherein the circuit arrangement includes a clocked switching mechanism with inputs for Gray code signals and an error output, and wherein the switching mechanism does not activate an error signal at the error output if, after a change of two signal levels at the inputs for Gray code signals within one time interval of a timing signal, the next signal change occurs again within one time interval of the timing signal at two inputs for Gray-coded signals.

The advantages achieved with the invention lie in particular in that the interruptions of measuring procedures due to error messages are reduced to a minimum. Moreover, the invention can be used directly instead of known congeneric circuit arrangements, without changes being necessary to the upstream or downstream function elements.

Other objects and advantages of the present invention will become apparent with reference to the description of the preferred embodiments contained herein.

BRIEF DESCRIPTION OF THE DRAWINGS

The invention will be described in more detail below with reference to the exemplary embodiments illustrated in the drawings, in which:

FIG. 3a, 3b and 3c show an input-output transformation diagram;

DETAILED DESCRIPTION OF THE PREFERRED EMBODIMENTS

Figure 1:
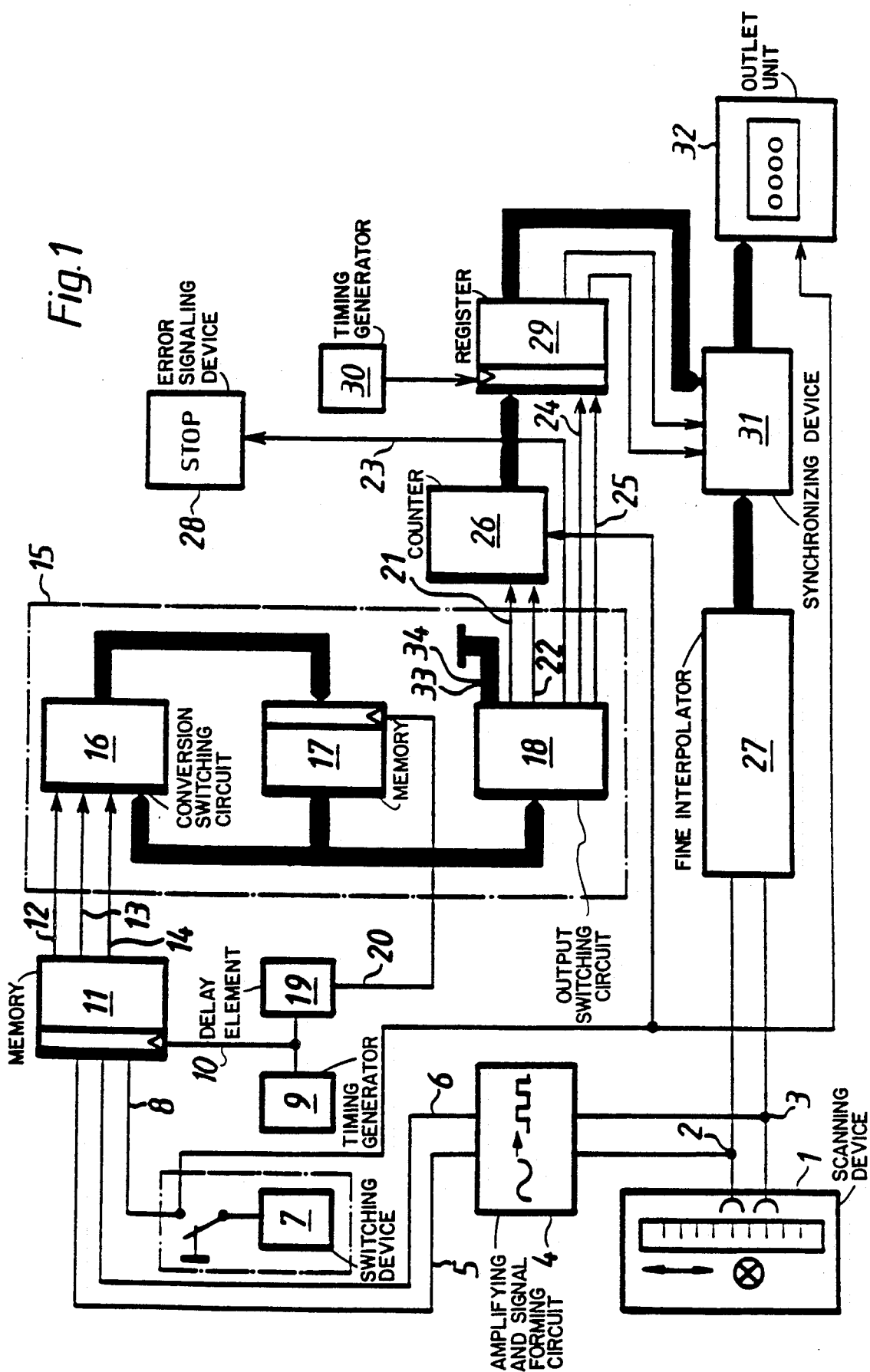
FIG. 1 shows the basic circuit diagram of a measurement circuit for a precision dimension measuring machine having network constructed according to the model of a Moore automaton.

FIG. 1 shows a known, for example, optoelectronic, measurement scanning device 1 which, depending on the X position of an object, outputs a sinX-proportional output signal 2 and a cosXproportional output signal 3. In a likewise known amplifying and signal-forming circuit 4, two square-wave logic signals 5, 6 which are phase-shifted by 90° to one another are generated from the two sinX and cosX-proportional signals 2, 3 which square-wave logic signals exhibit for each zero passage of the sinX or cosX signal 2, 3 a signal edge or level change. The pair of square-wave logic signals 5, 6 represents Gray code signals, since at each instant at most one signal 5 or 6 exhibits a signal edge. A reset signal 8 can be triggered by a switching device 7 and a timing generator 9 generates a clock pulse 10 with a defined clock frequency.

The two square-wave logic signals 5, 6 and the reset signal 8 are connected to the inputs of a register or memory device 11 which is controlled by the clock pulse 10. The levels of the signals 5, 6 and 8 present at the inputs of the memory device 11 at an instant $t_0$ defined by the clock pulse 10 are switched through to the outputs of the register and held during the time interval until the next clock pulse 10 at an instant $t_1$, at which the levels present at instant $t_1$ then are switched through.

From the two input signals 5 and 6 the memory device 11 thus forms the Gray code output signals 12 and 13 and from the reset input signal 8 the reset output signal 14. The output signals 12, 13 and 14 are synchronized here with the clock pulse 10 and always fixed for a fixed time interval.

The synchronized output signals 12, 13 and 14 are connected to the inputs of a network 15 which is constructed in this example according to the model of a Moore automaton and is composed of a conversion switching circuit 16, a register or memory device 17 and an output switching circuit 18. According to Kohavi, Z. Switching and Finite Automata Theory; McGraw-Hill New York 1978, the Moore automaton is defined in that the input signals 12, 13, 14 are Ⓡonly fed to the conversion switching circuit !6, but not at the same time to the output switching circuit 18 (cf. FIG. 5).

The outputs of the conversion switching circuit !6 are supplied via the memory device 17 not only to the output switching circuit 18, but are also fed back to inputs of the conversion switching circuit 16. The memory device 17 is controlled by the timing generator 9 via a delay element 19 by a clock pulse 20 which has the same frequency as the clock pulse 10, but which is delayed in consideration of the signal travel times in the elements 11, 16 and 17. It is possible, and realized in the example, to design the output switching circuit 18 as a simple unit switching network, that is to say as a direct through-connection from input to output. The output switching circuit 18 therefore contains no components and hence cannot cause any interference. All linking operations must therefore be combined in the conversion switching circuit 16.

The construction and function of switching mechanism or automata are known from communications technology (Kohavi, Z. loc. cit.) and will be explained in greater detail below with reference to FIG. 2 as applied in this example.

According to the invention, the network 15 supplies as an output signal two counting pulses 21 and 22 and an error signal 23. The counting pulses 21, 22 are realized in the example as decrementing (21) and incrementing (22) signals.

An advantageous option are the counter status signals 24 and 25 at two further outputs in the example. These serve to synchronize a counter 26 controlled by the counting pulses 21, 22 with a fine interpolator 27 provided as an option. The fine interpolator 27 and the synchronization are described in greater detail with reference to FIG. 4.

The error signal 23 is supplied to an error signaling device 28. Apart from providing an indication for a user, this error signaling device 28 can also perform automatic functions such as breaking off a measuring operation, beginning again from a defined start position, and triggering the reset signal 8.

The outputs of the counter 26 and the counter status signals 24 and 25 are supplied to a register 29 which is controlled by a further timing generator 30. In the example illustrated, the output signals of the register 29 and of the fine interpolator 27 are supplied to a synchronizing device 31 which forms the final measurement value from the input signals and supplies it to an output unit 32 via its output signals.

In the simplest case, the output unit 32 may be an indicator for the user, but as a rule, it usually also includes the transfer to automatic storage and computing systems. The network 15, the counter 26 and the output 32 can be switched to a basic position by the reset signal 8.

The function of an automaton is completely defined by the state transition graph illustrated in FIG. 2 which shows the state transition graph of a Moore automaton as a model for the network 15 in FIG. 1, the automaton generating the error signal 23 under the conditions according to the invention and acting as a quadruple interpolator, that is to say, generates a counting pulse 21 (decr.) or 22 (incr.) for each level change of the input signals 12 and 13 and hence four times per period of the sinX signal 2.

The automaton has 20 states S1 to S20 which are characterized by the combination of the logical values of the signals 21 to 25 and further internal signals (e.g. 33, 34). All input signals (12 to 14) and state signals (21 to 25, 33, 34) are square-wave signals, one level of which is associated with logical "1", and the other level of which is associated with logical "0".

Figure 2A:
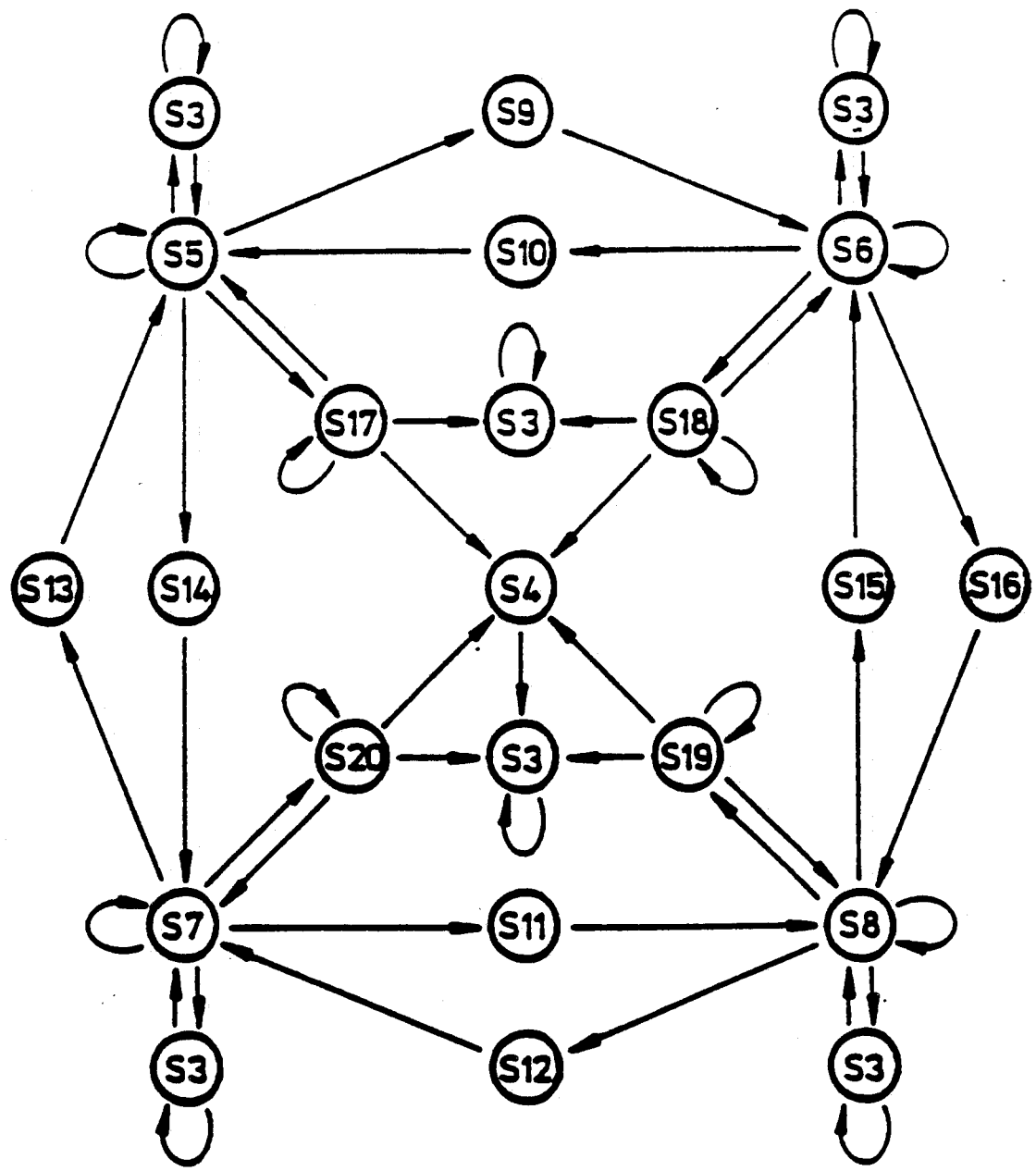
FIG. 2a and 2b show an example of a state transition diagram for a Moore automaton according to the invention for quadruple interpolation.
Figure 2B:
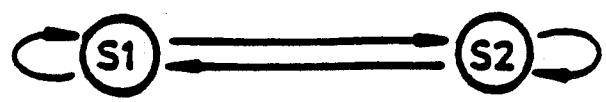

The state transition graph is divided into two parts (FIGS. 2a and 2b). FIG. 2a shows the partial state transition graph for the 18 states S3 to S20. The states Of the automaton are represented therein by circles. The state S3 is drawn six times. This allows a clear two-dimensional representation. Arrows mark transitions between the states. If the automaton is at state Si in a time interval N of the clock pulse 20 and if a defined combination of the input signals 12, 13 and 14 is present in this time interval N, then, upon transition into the time interval N+1, the transition from state Si occurs along a transition defined by this combination of 12, 13 and 14 to a state Sj. The state S3 is the basic state. It is obtained from the states S5 to S8 and S17 to S20 when the input signal 14, the reset signal, is activated.

The state S4 controls the transitions between the states S1 and S2 in FIG. 2b and hence the error message at the error output 23. S4 can be obtained from the states S17 to S20 and always switches over into the basic state S3. S5 to S8 are idle states. They are differentiated from one another by the signals 24 and 25.

The states S9 to S16 lie in the state transition graph between idle states S5 to S8: they are always obtained from an idle state S5 to S8 and switch over again in the next time interval of the clock pulse 20 into an idle state S5 to S8. As a result of this sequence, in each case a counting pulse 21, 22 is generated. Four each of the states S9 to S16 are incrementing and decrementing pulse generators.

The states S17 to S20 are obtained from the idle states S5 to S8 when the input signals 12 and 13 exhibit a Gray code error. If in a following time interval of the clock pulse 20 only one of the input signals 12 or 13 changes, then the states S17 to S20 switch over into the state S4. This subsequently activates an error message. Without changing the input signals 12 and 13, the state S17 to S20 remains, if both input signals 12 and 13 are changed, the automaton again returns to the preceding idle state S5 to S8, as a result of which unnecessary error message are avoided.

FIG. 2b illustrates the partial state transition graph for the states S1 and S2 "error status set" in the same representation. The states are marked by the signal 23. In state S2, the signal 23 is activated and hence the error message is output. The transition from state S1 to state S2 occurs when the state S4 is obtained in the partial state transition graph of FIG. 2a. The state S1 is obtained from the state S2 when the reset signal 14 is activated.

In each period of the input square-wave signals 5 and 6 (corresponding to sinX(t) (2) and cosx(t) (3)), the two signals 5 and 6 together show four signal edges. This is also the case after the synchronization in memory device 11 for the signals 12 and 13. The signal edge sequence frequency at the inputs of the network 15 is therefore four times the signal frequency of 5 or 6. A counting event (e.g. S8–S12 –S7) requires two transitions, that is to say, two time intervals of the clock pulse 20. For this reason, the clock frequency of the clock pulse 20—and hence also of the clock pulse 10—must be at least eight times the greatest signal frequency.

Owing to the memory device 11, the shortest pulse duration of an interference signal at the signal inputs 12 or 13 of the network 15 is just equal to on ®time interval of the clock pulse 10 or 20. If the signal edges of the measurement signals succeed one another in the space of only two time intervals of the clock pulse 10 or 20, then, due to interference signals, numerous simple Gray code infringements arise on the signal inputs 12 and 13 which, however, are not yet present at all in the unclocked input signals 5 and 6.

It is therefore advantageous to select the clock frequency of the clock pulse 10 or 20 to be at least twenty times as great as the signal frequency, so that at least five time intervals of the clock pulse 10 or 20 lie between each two edges of the measurement signals on the signal lines 12 and 13. In each of four time intervals, a single interference pulse on a line 12 or 13 can lead to an incrementing and decrementing pulse pair 22 and 21 with the sum zero and also a double Gray code infringement can be detected. A great part of the interference can thus be processed without damage. The maximum permissible clock frequency of the clock pulse 10 or 20 is defined by the maximum signal travel times in between elements 11, 16 to 18 or 47 to 50 and 26.

As a result of the design of the state transition graph (FIG. 2), which requires at least two transitions and hence time intervals of the clock pulse 20 per counting pulse 21 or 22, the advantage is also obtained that the counting pulses 21 or 22 with their duration of one time interval of the clock pulse 20 can never succeed each other without a pause, so that malfunctions of the counter 26 are avoided.

FIG. 3 shows a signal state diagram which shows as an example the temporal sequence of input signals 12 and 13 and the states S4 to S20 thereby controlled for the Moore automaton according to the state transition graph of FIG. 2. The states S1 and S2 (FIG. 2b) are not directly influenced by the input signals 12 and 13, as also the basic state S3 which is obtained from S4 or by the reset signal 14.

FIG. 3a shows an example of an undisturbed signal sequence. The clock frequency is twenty times the maximum signal frequency and this is fully utilized, that is to say, after every five time intervals of the timing signal one input signal 12 or 13 changes in each case. There are shown above one another the clock pulse 10, the input signals 12 and 13, the states Si from S4 to S20, their meaning and the counter status of counter 26.

The states Si are assumed in the real network 15 in the rhythm of the clock pulse 20, which is phase-shifted with respect to the clock pulse 10 of the memory device 11 and of the input signals 12 and 13. The meaning of the states Si is indicated by arrows for the generation of the incrementing (22) and decrementing (21) pulses. An exclamation mark marks the states S17 to S20 which are obtained when the input signals 12 and 13 exhibit a Gray code error. A cross marks the error message in state S4.

FIG. 3b shows examples for interference pulses which occur simultaneously on both input signals 12 and 13. Regardless of the polarity of the interference pulses, counting is not impaired in the examples 35 and 36, the first Gray code infringement leads to the states S17 to S20 and the following second Gray code infringement leads back to an idle state S5 or S7.

This contrasts with example 37, where the interference pulse in the input signal 12 "swallows" a measurement signal change. As a result the leading edge of the interference pulse on the input signal 12 is also undetectable. The leading edge of the interference pulse on the input signal 13 therefore causes an incorrect decrementing. The trailing edge of the interfering pulse first occurs at the two input signals 12 and 13; this Gray code infringement causes the transition into the state S17. However, the next measurement signal change does not produce a Gray code infringement and thus the transition occurs into the state S4 "signal Gray code error" and as a result into S2 "error status set", where the error signal 23 is activated, and into the basic state S3.

FIG. 3c shows an example indicating that also interference pulses on only one input signal 12 or 13 may lead to Gray code infringements. In example 38, leading and trailing edges of the interference pulse on the input signal 13 coincide with two measurement signal edges on the input signal 12. There is therefore a double Gray code infringement and the automaton goes from the idle state S7 via the state S20 again to the idle state, without triggering a counting pulse. Even without interference pulse, the two edges of the measurement signal on the input signal 12 when summed would not result in a counting, since an incrementing and a decrementing event cancel each other.

In example 39, an interference pulse has its leading edge at the same time as the edge of a measurement signal on the other signal 13. This Gray code error causes the transition into state S17. With the trailing edge of the interference pulse, only one input signal 12 changes, and hence the transition from state S17 into state S4 "signal Gray code error" results.

The states of the automaton are defined, inter alia, by the signals 24 and 25. It was already described above that these signals 24 and 25 can be optionally connected to the output of the network 15, in order to synchronize a fine interpolator 27 with the quadruple interpolator. It can be seen from the state transition graph of FIG. 2a that a counting operation of the network 15 applied as a quadruple interpolator always leads from a consequent state (e.g. S7) to a counting pulse generator state (e.g. S13) and further to a next consequent state (e.g. S5), the changed incrementing or decrementing signal 21 or 22 being reset again. One of the signals 24 or 25 changes its level synchronously thereto. The signals 24 and 25 thus form a 2-bit Gray code counter which serves internally for differentiating the consequent states S5 to S8. Their logical value specifies in each case in which quadrant the sinX and cosX input functions 2 and 3 of the quadruple interpolator stand. Their use for synchronizing a fine interpolation device is described below.

If between two values of the counter 26 of the quadruple interpolator 11 to 29 a fine interpolation 27 is performed from the value scanning of the sinX and cosX signals 2 and 3 of the scale scanning device 1, the results from both methods must be combined correctly.

Figure 4:
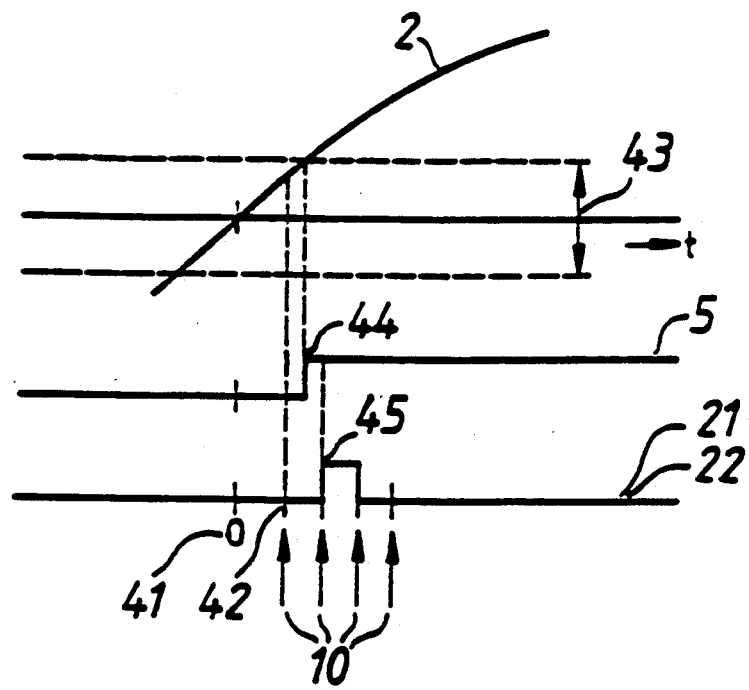
FIG. 4 shows hysteresis in the generation of the Gray code pulses (for synchronizing quadruple and fine interpolation)

FIG. 4 illustrates how, for example, in the case of a scanning 42 (clock pulse 10) occurring directly after a zero passage 41 of the sinX(t) signal 2, owing to the necessary hysteresis 43 of a sine comparator of the amplifying and pulse forming circuit 4, the level change 44 of the square-wave logic signal 5 is not yet generated. Until the generation of a counting pulse 45 on one of the incrementing/ decrementing pulse lines 21, 22 and of the counter status in the counter 26, further delays result in the elements 11, 15 and 26 (FIG. 1).

However, the fine interpolation device 27 operates already in the quadrant of the sinX(t) function (signal 2) following the zero passage 41. When combining, the counter status of the counter 26 must therefore be corrected by ±1.

According to the known prior art, the information for correcting the counter status is taken from the two lowest-value bits of the counter status of the counter (corresponds to 26). The assignment of these bits to the quadrant of the sinX(t) function 2 must here first be obtained from a synchronization operation, in that the measurement machine travels very slowly after switching on, until a first counting pulse (21 or 22) and counter status are generated and said counter status is assigned to the quadrant detected in the fine interpolation device 27, or until the region of the hysteresis 43 has been safely exited and the counter 26 is loaded according to the quadrant detected in the fine interpolation device.

Problems arise thereby in the case of a great difference between static friction and sliding friction, for example, slip-stick effects, which also leads to the synchronization frequently lasting a disturbingly long time.

Owing to the use of the signals 24 and 25 generated in the network 15 according to the invention, the synchronization is achieved directly in the synchronization device 31 and the problems of the known method are no longer present.

Figure 5:
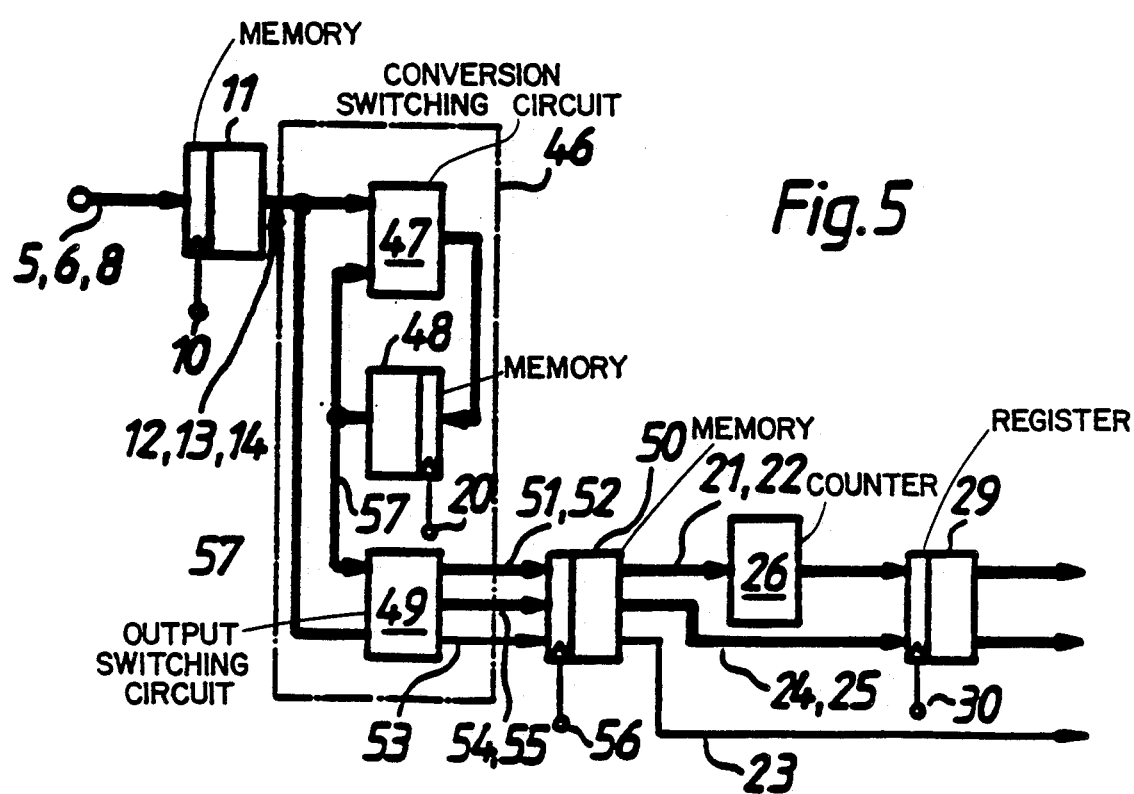
FIG. 5 shows a basic circuit diagram for an interpolation automaton according to the model of a Mealy automaton.

The circuit arrangement according to the invention is shown as a further example in FIG. 5 according to the model of a Mealy automaton. As in the circuit according to FIG. 1, Gray code square-wave signals 5, 6 and 8 are synchronized in the memory device 11 with the clock pulse 10 and then provided as signals 12, 13 and 14. These are now processed by the network 46, which is composed of a conversion switching circuit 47, a register or memory device 48 and an output switching circuit 49.

The outputs 51 and 55 of the network 46 are connected to a memory device 50. The memory device 50 is controlled by a timing signal 56 with the frequency of the timing signals 10 and 20. The same signals 21 to 25 are available at the outputs of the memory device 50 as at the outputs of the network 15 according to the model of the Moore automaton (FIG. 1). They are also processed in the same manner in a counter 26, an output register 29 with timing signal 30 etc., as illustrated in FIG. 1.

The network 46 differs from the network 15 of FIG. 1 in that the output switching circuit 49 is also connected directly to the input signals 12 to 14. The network 46 is thus characterized as a technical realization of a Mealy automaton (cf. Kohavi, Z. Loc. cit.).

Since the output switching circuit 49 is not only connected to signals 57, which arise as the output of the memory device 48, but also directly to the input signals 12, 13 and 14, the output switching circuit 49 cannot be realized as a trivial unit switching network like the output switching circuit 18 in FIG. 1.

From the complex structure follows the possibility of function hazard, that is to say, interfering effects may occur in the output 51 to 55. In order to avoid malfunctions of the circuit arrangement resulting therefrom, the memory device 50 must be provided.

The circuit arrangement with a network 46 according to the model of a Mealy automaton is therefore of more complex construction with the output switching network 29 and the memory device 50 than the circuit shown in FIG. 1 with the network 15 according to the model of a Moore automaton.

The state transition graph, which defines the function of the network 46 as a quadruple interpolator with error signal generation (23) according to the invention, is obtained from the known transfer of the state transition graph for the Moore automaton (FIG. 2) to the version for a Mealy automaton.

The method according to the invention can be realized with networks which employ digital electronics. For example, the network 15 according to FIGS. 1 and 2 can be accommodated in a programmable logic component PLD, for example type EP320PC of Messrs. Altera. A component of this kind contains all-purpose switching networks and registers. In a programming operation, connection lines are defined and the desired switching mechanism structure is thus achieved.

The methods and arrangements according to the invention may, however, also be realized in other technologies, for example with optical signal processing. The application of the invention has been demonstrated using the example of the precision dimension measuring machines. It can, however, be applied in general to systems using Gray code signals. Also, the invention can be applied to n-bit Gray code signals where n is greater than 2.

What is claimed is:

1. A code conversion method comprising: converting Gray code signals into counting pulses; and processing the Gray code signals with a network to form a counter status, detect interference signals infringing the Gray code and form an error signal; wherein a network does not form an error signal if, following a change of two input signals within a time interval which constitutes a first Gray code infringement, the next signal change within one time interval comprises two input signals which constitutes a second Gray code infringement.

2. The method as claimed in claim 1, wherein the network comprises a Moore automaton.

3. The method as claimed in claim 1, wherein the network comprises a Mealy automaton.

4. The method as claimed in claim 1, wherein the input signals are two-state logic signals and changes in the input signals cause changed states of the network; and further comprising generating a timing signal which defines the time intervals for signal processing and providing the timing signal to the network.

5. The method as claimed in claim 1 wherein a single, double or quadruple interpolation is executed during the conversion of the Gray code signals into the counting pulses.

6. The method as claimed in claim 1, wherein the Gray code signals are indicative of dimensions measured by a measurement scanning device.

7. The method as claimed in claim 1 wherein
   (a) the network forms two counting pulses which control an incrementor/decrementor;
   (b) the input signals are synchronized with the network; and
   (c) output signals of the network and of the counter are synchronized with the subsequent signal processing.

8. The method as claimed in claim 5, wherein two signals, which are formed in the network for the internal function of error detection and which represent a 2-bit Gray code counter for the Gray code signals, are provided as additional output signals and are used for synchronizing the single, double or quadruple interpolation with a fine interpolation.

9. The method as claimed in claim 4, wherein the network separates one counting pulse from the next counting pulse by at least one time interval of the timing signal.

10. An apparatus comprising: first means for converting Gray code signals into counting pulses; second means for forming a counter status which detects interference pulses infringing the Gray code and forms a corresponding signal level at an error output, wherein said second means includes a network with inputs for Gray code signals and an error output, and wherein the network does not activate an error signal at the error output if, after a change of two signal levels at the inputs for Gray code signals within one time interval of a timing signal, the next signal change occurs again within one time interval of the timing signal at two inputs for Gray-coded signals.

11. The apparatus as claimed in claim 10, wherein
   (a) the network is constructed according to the model of a Moore automaton and comprises a conversion switching network, a register and an output switching network;
   (b) a register connected upstream of the inputs of the network;
   (c) an incrementor/decrementor connected downstream of first and second outputs of the network and the outputs of the counter; and
   (d) a register connected to third and fourth outputs of the network.

12. The apparatus as claimed in claim 10, wherein
   (a) the network is constructed according to the model of a Mealy automaton and comprises a conversion switching network, a register and an output switching network;
   (b) a first register connected upstream of the inputs of the network;
   (c) a second register connected downstream of the outputs of the network;
   (d) a counter coupled to the network via the second register; and
   (e) a third register coupled to the outputs of the counter and outputs of the second register.

13. The apparatus as claimed in claim 10, further including a measurement scanning device; and wherein the Gray-coded signals are generated as 90° phase-shifted square-wave logic signals by means of a signal forming device coupled to the first means from sine and cosine signals received from the measurement scanning device, and further wherein the apparatus comprises a single, double or quadruple interpolator which outputs one counting pulse for every fourth, second or first signal edge of the Gray-coded signals.

14. The apparatus as claimed in claim 10, wherein:
   (a) the conversion switching network includes two signal outputs indicative of error detection and signaling which represent a 2-bit Gray code counter for the Gray-coded signals and wherein
   (b) the two signal outputs are fed via a first register and the output switching network as output signals of the network via a second register to outputs wherein the outputs are supplied to a synchronization device for synchronizing with a fine interpolation device.

15. The apparatus as claimed in claim 10, wherein a counting pulse is separated from the next counting pulse by at least one time interval of the timing signal.

* * * * *